United States Patent
Huh et al.

[11] Patent Number: 5,833,760
[45] Date of Patent: Nov. 10, 1998

[54] APPARATUS AND METHOD FOR CLEANING SEMICONDUCTOR DEVICES WITHOUT LEAVING WATER DROPLETS

[75] Inventors: Dong-Chul Huh; Chang-Yong Jung, both of Suwon, Rep. of Korea

[73] Assignee: Samsung Electronics Co., Ltd., Suwon, Rep. of Korea

[21] Appl. No.: 773,337

[22] Filed: Dec. 26, 1996

[30] Foreign Application Priority Data

Dec. 30, 1995 [KR] Rep. of Korea ............... 1995 68618

[51] Int. Cl.⁶ ......................................... C03C 23/00
[52] U.S. Cl. ........................... 134/2; 134/34; 134/32; 134/902; 134/3
[58] Field of Search ................. 134/902, 1, 3, 134/26, 32, 34, 961, 2

[56] References Cited

U.S. PATENT DOCUMENTS

| | | | |
|---|---|---|---|
| 4,899,767 | 2/1990 | McConnell et al. | 134/56 R |
| 4,911,761 | 3/1990 | McConnell et al. | 134/11 |
| 5,331,987 | 7/1994 | Hayashi et al. | 134/102.1 |
| 5,520,744 | 5/1996 | Fujikawa et al. | 134/11 |
| 5,653,045 | 8/1997 | Ferrell | 34/341 |
| 5,685,086 | 11/1997 | Ferrell | 34/61 |

OTHER PUBLICATIONS

Koppenbrink et al, Vapor Displacement Drying After Wet Processing, Particles on Surfacess 2, Plenum Press, pp. 235–243, 1989.

*Primary Examiner*—Jill Warden
*Assistant Examiner*—Alexander Markoff
*Attorney, Agent, or Firm*—Jones & Volentine, L.L.P.

[57] ABSTRACT

A method and an apparatus for cleaning semiconductor devices, in which water droplets are completely eliminated after the wafer is cleaned in the course of the semiconductor manufacturing process. In the method and apparatus, after the thin film is cleaned, a cut off valve cuts off the supply of cleaning solution to a cleaning container. At the same time, a first drain valve, second drain valve, and third drain valve respectively open a first drain path, a second drain path, and third drain path in serial order, with a predetermined time interval between each stage, thereby slowly draining the cleaning solution from the container. The cleaning solution is easily and nearly completely separated from the wafer due to the surface tension of the cleaning solution, and no large drops of the cleaning solution are left on the wafer.

5 Claims, 3 Drawing Sheets

APPARATUS AND METHOD FOR CLEANING SEMICONDUCTOR DEVICES WITHOUT LEAVING WATER DROPLETS

BACKGROUND OF THE INVENTION

1. Field of the Invention

The present invention relates to an apparatus and a method for cleaning semiconductor devices, and more particularly, to an apparatus and a method for cleaning semiconductor devices where water droplets are completely eliminated after the wafer is cleaned in the course of the semiconductor manufacturing process.

2. Background of the Invention

In the course of the semiconductor manufacturing process, after a polysilicon film is formed and before a silicide film is formed on the polysilicon film, the wafer having the polysilicon film formed thereon is cleaned by means of a solution (DHF) containing deionized water (DI) and hydrofluoric acid (HF) mixed at a ratio of about one hundred to one, in order to strengthen the adhesion between the polysilicon film and the silicide film.

However, in the conventional semiconductor manufacturing process, water droplets are usually left on the polysilicon film after the wafer is cleaned by means of the DHF solution.

As shown in FIGS. 1A and 1B, a gate oxide film 110 and a polysilicon film 120 are formed on a silicon substrate 100 in serial order, and then the surface of the polysilicon film 120 is cleaned by the DHF solution. Thereafter, a silicide film 130 is formed on the polysilicon film 120. After the cleaning process, however, water droplets 121 may have remained on the surface of the polysilicon film 120 at the interface between the polysilicon film 120 and the silicide film 130 as shown in FIG. 1B.

Thereafter, a photoresist pattern 140 is formed on the silicide film 130 as shown in FIG. 1C, and then the silicon film 130 and the polysilicon film 120 are selectively etched by an isotropic plasma etch. In this case, the water droplet 121 functions in the same manner as an oxide film would during the etching process, thereby preventing the polysilicon film 120 under the water droplet 121 from being etched as shown in FIG. 1D.

Water droplets form because the wafer is not completely dried after the polysilicon film 120 is cleaned. Especially in the case where the selectivity between the polysilicon film and the oxide film is high in order to prevent the gate oxide film 110 from being etched, the formation of water droplets 121 happens often, to the point where a bridge phenomenon occurs.

A bridging phenomenon means that since the polysilicon film 120 is prevented from being etched, or is partially etched, due to the existence of the water droplet 121, a polysilicon line and an adjacent line are joined to each other rather than being separated from each other.

In cleaning and drying the wafer, a robot picks up the wafer out of a cleaning container after the wafer is cleaned by means of the DHF solution, and then the wafer is dried. However, part of the deionized water is left on the polysilicon film 120 even after the drying process, thereby forming the water droplet which, as discussed above, has a critical effect on the proper formation of the semiconductor devices.

FIG. 2 schematically shows the construction of a conventional apparatus for cleaning semiconductor devices.

Referring to FIG. 2, a supply path 1 and a drain path 3 are connected to a cleaning container 10. A supply valve 20 is disposed in the supply path 1 and controls the supply of the cleaning solution into the cleaning container 10. A manually operated drain valve 40 is disposed in the drain path 3 and controls the draining of the cleaning solution from the cleaning container 10.

A supplemental valve 30 is disposed in a supplemental path 2 in parallel with the supply valve 20. The supplemental path 2 is connected to the supply path 1 at either side of the supply valve 20, so as to arrange a bypass for the cleaning solution supplied into the cleaning container 10. The supplemental valve 30 controls the supplying of the cleaning solution bypassing the supply valve 20 through the supplemental path 2.

However, in the conventional cleaning apparatus as described above, after the polysilicon film 120 has been cleaned in the cleaning container 10, and a robot picks out the wafer from the cleaning container 10, the cleaning solution is then drained out while the supply of the cleaning solution through the supply path 1 is cut off. Therefore, a fair amount of cleaning solution remains on the cleaning container 10 and is not completely eliminated during the succeeding drying process. A part of such remaining solution that is not dried forms the water droplets after the drying process.

SUMMARY OF THE INVENTION

The present invention has been constructed to overcome one or more of the problems of the conventional art. Accordingly, it is an object of the present invention to provide a method for cleaning semiconductor devices where water droplets are completely eliminated after the wafer is cleaned in the course of the semiconductor manufacturing process.

It is another object of the present invention to provide an apparatus for cleaning semiconductor devices where the cleaning solution is slowly drained from the cleaning container, such that water droplets are completely eliminated due to the surface tension of the cleaning solution on the wafer, after the wafer is cleaned in the course of the semiconductor manufacturing process.

To achieve these and other objects, the present invention provides a method for cleaning a thin film formed on a wafer, the method comprising the steps of: placing the wafer, having a thin film formed thereon, into a container having a cleaning solution supplied thereto; cleaning the thin film on the wafer in the cleaning solution; cutting off the supply of the cleaning solution to the container; and slowly removing the wafer from the cleaning solution while slowly draining the cleaning solution out of the container.

The present invention further provides an apparatus for cleaning a thin film formed on a wafer, the apparatus comprising: a cleaning solution container; a supplying assembly for controlling supplying of the cleaning solution into the container, the supplying assembly including a supply valve disposed in a supply path, a bypass valve connected to the supply path in parallel with the supply valve, a cut off valve connected to the supply path, respectively in series with the supply valve and the bypass valve, the supply path being connected to the container, the cut off valve being disposed between the supply valve and the container; and a draining assembly for controlling draining of the cleaning solution from the container, the draining assembly including first, second, and third drain valves connected in parallel with each other and connected to the container through respective first, second, and third drain paths, wherein the cut off valve cuts off the supplying of the cleaning solution after the thin film is cleaned by the cleaning solution in the container, and simultaneously, the first drain valve, the second drain valve, and the third drain valve respectively open the first drain path, the second drain path, and the third drain path in serial order with a predetermined time interval therebetween, thereby slowly draining the cleaning solution from the container.

BRIEF DESCRIPTION OF THE DRAWINGS

The above objects, and other features and advantages of the present invention will become more apparent by describing in detail preferred embodiments thereof with reference to the attached drawings, in which.

DETAILED DESCRIPTION OF PREFERRED EMBODIMENTS

A preferred embodiment of the present invention will be described in detail with reference to the accompanying drawings.

Figure 1A:
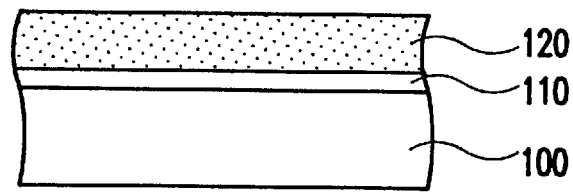
FIGS. 1A to 1D are side sectional views of a semiconductor device, illustrating a conventional method for manufacturing the semiconductor device including a cleaning process.
Figure 1B:
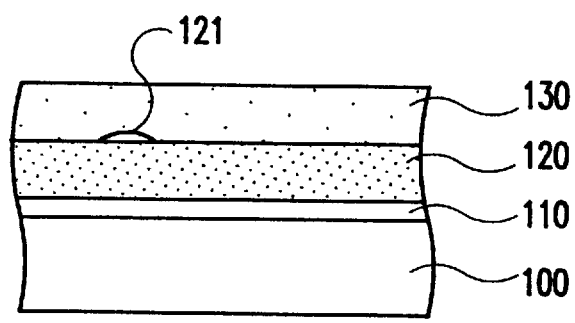
Figure 1C:
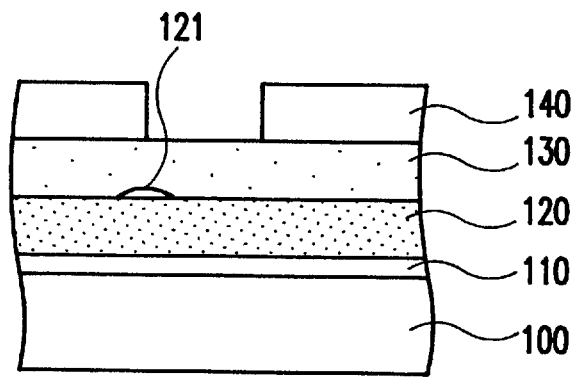
Figure 1D:
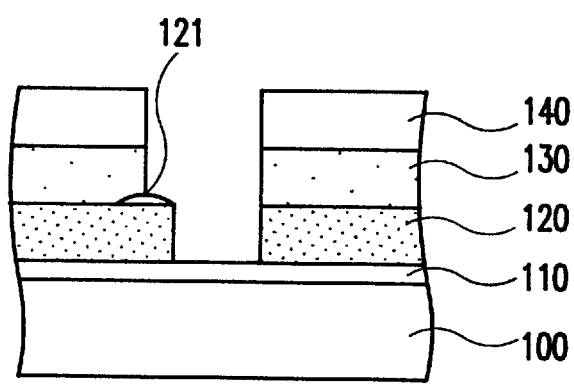
Figure 2:
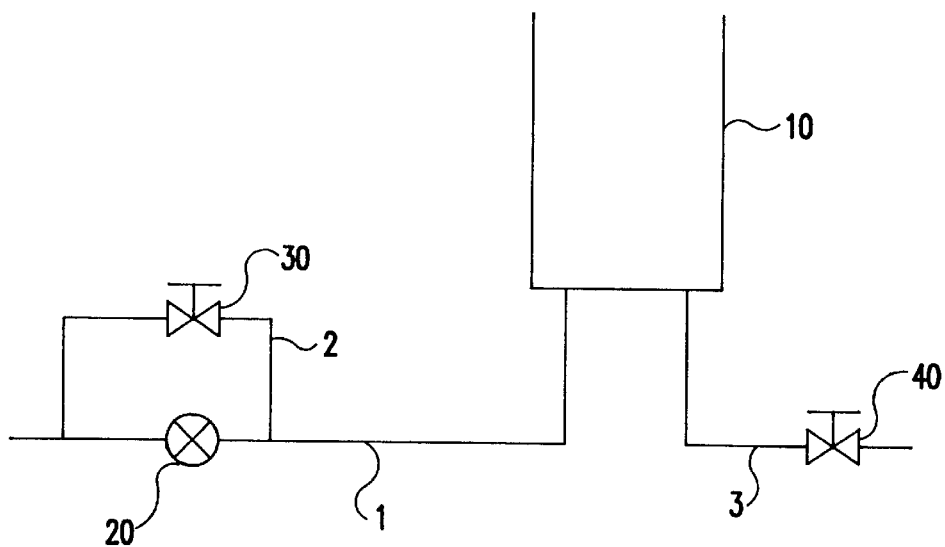
FIG. 2 is a hydraulic circuit diagram of a conventional apparatus for cleaning semiconductor devices.
Figure 3:
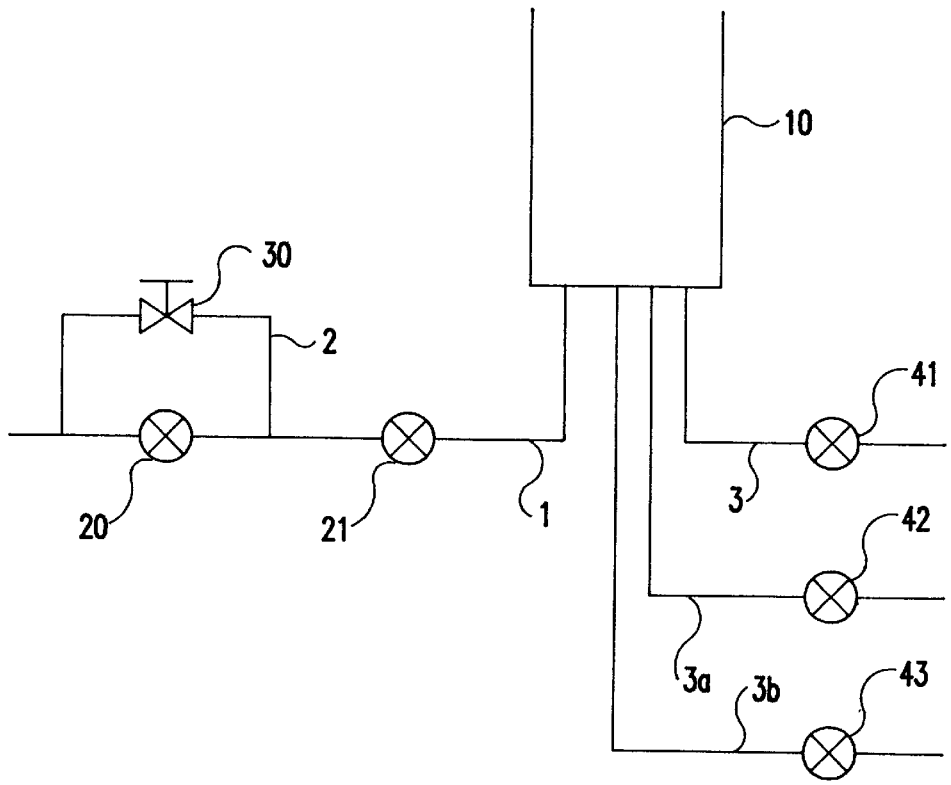
FIG. 3 is a hydraulic circuit diagram of an apparatus for cleaning semiconductor devices according to an embodiment of the present invention.

FIG. 3 schematically shows the construction of an apparatus for cleaning semiconductor devices according to an embodiment of the present invention. A supply path 1, and first, second, and third drain paths 3, 3a, and 3b, are connected to a cleaning container 10. The first, second, and third drain paths 3, 3a, and 3b have respective first, second, and third valves 41, 42, and 43 disposed therein. The valves may be an air valve or a manually operated valve.

A supply valve 20 for supplying the cleaning solution, and a cut off valve 21 for cutting off the cleaning solution, are disposed in the supply path 1. The cleaning solution comprises, e.g., deionized water (DI) and hydrofluoric acid (HF) mixed at a ratio of 100 to 1. A supplemental valve 30 is disposed in a supplemental path 2 in parallel with the supply valve 20. The supplemental path 2 is connected to the supply path 1 at either side of the supply valve 20, so as to arrange a bypass for the cleaning solution supplied into the cleaning container 10. The supplemental valve 30 controls the supplying of the cleaning solution bypassing the supply valve 20 through the supplemental path 2.

In the cleaning apparatus according to the present invention as described above, a wafer to be cleaned is transferred into the cleaning container 10 by a robot and is cleaned therein for a predetermined period. After the cleaning process is finished, the cut off valve 21 cuts off the supply of the cleaning solution at the same time the robot starts to slowly pick up the wafer out of the cleaning container 10 so as to move it to a rotary drier. At the same time, the first, second, and third drain valves 41, 42, and 43 respectively open the first, second, and third drain paths 3, 3a, and 3b in serial order, with a predetermined time interval therebetween, thereby slowly draining the cleaning solution from the cleaning container 10.

In this embodiment, the level of the cleaning solution in the cleaning container 10 is slowly lowered while the wafer immersed in the solution is slowly picked up by the robot. Therefore, the cleaning solution is easily and nearly completely separated from the wafer due to the surface tension of the cleaning solution, and no large drops of the solution are left on the wafer. Thereafter, feeble humidity, which may be left on the wafer, is completely eliminated during the following drying process, so that water droplets are prevented form forming on the wafer.

As described above, the apparatus and the method according to the present invention prevents water droplets from being formed on a wafer while the wafer is cleaned, thereby preventing the etching of a film on the wafer from being disturbed by the water droplet. Accordingly, the yield of the semiconductor devices manufactured by the method and the apparatus according to the present invention is improved.

While the present invention has been particularly shown and described with reference to the particular embodiment thereof, it will be understood by those skilled in the art that various changes in form and details may be effected therein without departing from the spirit and scope of the invention as defined by the appended claims.

What is claimed is:

1. A method for cleaning a thin film formed on a wafer, said method comprising the steps of:

supplying a cleaning solution into a container;

as the cleaning solution is supplied into the container, placing the wafer into the container, and cleaning the thin film on the wafer in the cleaning solution;

cutting off the supply of the cleaning solution into the container;

picking the wafer up from the cleaning solution;

opening a first drain passage connected to the bottom of the container as the wafer is being piked up from the cleaning solution in the container to drain the cleaning solution from the container through the first drain passage;

subsequent to said opening of the first drain passage and while the cleaning solution is being drained through the first drain passage, opening a second drain passage connected to the bottom of the container as the wafer is still being picked up from the cleaning solution in the container; and subsequent to said opening of the second drain passage and while the cleaning solution is being drained through the first and the second drain passages, opening a third drain passage connected to the bottom of the container as the wafer is still being picked up from the cleaning solution in the container.

2. A method as claimed in claim 1, wherein said supplying of cleaning solution into the container comprises supplying a mixture of deionized water and hydrofluoric acid into the container.

3. A method as claimed in claim 2, wherein the deionized water and hydrofluoric acid are in a mixture at a ratio of 100 to 1.

4. A method as claimed in claim 1, wherein said cutting off of the supply of the cleaning solution and said picking the wafer up from the cleaning solution are carried out simultaneously.

5. A method for cleaning a thin film formed on a wafer, said method comprising the steps of:

supplying a cleaning solution into a container;

as the cleaning solution is supplied into the container, placing the wafer into the container, and cleaning the thin film on the wafer in the cleaning solution;

cutting off the supply of the cleaning solution into the container;

once the supply of the cleaning solution into the container has been cut off, picking the wafer up out of the container to remove the wafer from the cleaning solution; and once the supply of the cleaning solution into the container has been cut off, opening a plurality of drain passages, connected to the bottom of the container, one after the other as the wafer is being picked up out of the container to drain the cleaning solution from the container simultaneously through all of the drain passages at a rate that inhibits drops of the cleaning solution from remaining on the thin film of the wafer when the wafer is removed from the cleaning solution by said picking the wafer up out of the container.

* * * * *